United States Patent
Nam et al.

(10) Patent No.: US 11,907,813 B2
(45) Date of Patent: Feb. 20, 2024

(54) METHOD FOR MITIGATING SEAWATER INTRUSION BY USING SEAWATER INJECTION

(71) Applicant: Dong-A University Research Foundation for Industry-Academy Cooperation, Busan (KR)

(72) Inventors: Byunghee Nam, Busan (KR); Namsik Park, Busan (KR); Roshina Babu, Incheon (KR)

(73) Assignee: DONG-A UNIVERSITY RESEARCH FOUNDATION FOR INDUSTRY-ACADEMY COOPERATION, Busan (KR)

( * ) Notice: Subject to any disclaimer, the term of this patent is extended or adjusted under 35 U.S.C. 154(b) by 558 days.

(21) Appl. No.: 17/140,139

(22) Filed: Jan. 4, 2021

(65) Prior Publication Data
US 2022/0213670 A1 Jul. 7, 2022

(51) Int. Cl.
G06N 20/00 (2019.01)
G01V 9/02 (2006.01)
G06F 30/20 (2020.01)

(52) U.S. Cl.
CPC .............. *G06N 20/00* (2019.01); *G01V 9/02* (2013.01); *G06F 30/20* (2020.01); *E02B 2201/02* (2013.01)

(58) Field of Classification Search
CPC .......... G01V 9/02; G06F 30/20; G06N 20/00; E02B 2201/02
See application file for complete search history.

(56) References Cited

U.S. PATENT DOCUMENTS

| | | | |
|---|---|---|---|
| 10,815,648 B2 * | 10/2020 | Park | E02B 1/003 |
| 2001/0052774 A1 * | 12/2001 | Rossi | G01V 9/02 |
| | | | 324/357 |

FOREIGN PATENT DOCUMENTS

| | | |
|---|---|---|
| KR | 1020140111776 A | 9/2014 |
| KR | 101551889 B1 | 9/2015 |

* cited by examiner

*Primary Examiner* — Janine M Kreck
(74) *Attorney, Agent, or Firm* — CANTOR COLBURN LLP

(57) ABSTRACT

According to an embodiment, there is provided a method for mitigating seawater intrusion in the ground where an aquifer having a seawater-fresh water interface is formed, the method including: installing an injection well at a point on an inland area, spaced apart from the sea by a predetermined distance, to a predetermined injection depth (d), the injection well having a predetermined screen height; injecting seawater into the aquifer by a predetermined quantity of injection through the injection well; and forming an upper seawater area around the injection well by the injection of the seawater, wherein the upper seawater area is an area that is filled with seawater in an upper portion of the aquifer.

11 Claims, 5 Drawing Sheets

METHOD FOR MITIGATING SEAWATER INTRUSION BY USING SEAWATER INJECTION

BACKGROUND

1. Field

The present disclosure relates to a method for mitigating seawater intrusion, and more particularly, to a method for mitigating seawater intrusion which can prevent seawater intrusion in a new way of injecting seawater into an aquifer.

2. Description of the Related Art

On the seashore, seawater permeates the ground through a permeable layer and occasionally contaminates groundwater. In particular, when groundwater is used in excess of an amount available in a corresponding region, the water table drops and seawater more permeates, and, when seawater permeates an aquifer under the ground, water quality of the aquifer may not recover for years and the aquifer may lose its value as a water intake source.

Related-art methods for preventing or mitigating seawater intrusion are illustrated in FIGS. 1A to 1C. FIG. 1A illustrates a method for preventing seawater intrusion into land by using a barrier 1 installed underground on the seashore. In FIG. 1A, WT indicates a water table and IF indicates an interface between seawater and fresh water.

FIG. 1B illustrates a method of injecting fresh water into an aquifer by using a well 2 installed in the aquifer of land. As shown in FIG. 1B, fresh water injected into the aquifer pushes out seawater and the seawater-fresh water interface IF retreats to the sea.

FIG. 1C illustrates a method of pumping seawater intruding into land. That is, as shown in FIG. 1C, a well 3 is installed under a seawater-fresh water interface IF and seawater intrusion is mitigated by pumping seawater through the well 3.

However, the method of FIG. 1A requires the long barrier 1 to be installed underground along the seashore and have a problem that much time and much cost are required, and also, is not eco-friendly since a passage for underground fresh water to go to the sea is blocked. The fresh water injection method of FIG. 1B and the seawater pumping method of FIG. 1C have problems that the wells 2, 3 should be installed to a considerable depth and the methods should continuously inject fresh water or pump seawater through the wells 2, 3.

CITED REFERENCES

Patent Document 1: Korean Patent Laid-Open Publication No. 2014-0111776 (published on Sep. 22, 2014)
Patent Document 2: Korean Patent Registration No. 10-1551889 (published on Sep. 9, 2015)

SUMMARY

The present disclosure has been developed in order to solve the above-described problems, and an object of the present disclosure is to provide a method and an apparatus for mitigating seawater intrusion, which reduce a width of a fresh water outflow channel by forming an upper seawater area by injecting seawater into an upper area of an aquifer, and makes a seawater-fresh water interface retreat to the sea.

According to an embodiment of the present disclosure, there is provided a method for mitigating seawater intrusion in the ground where an aquifer having a seawater-fresh water interface is formed, the method including: installing an injection well at a point on an inland area, spaced apart from the sea by a predetermined distance, to a predetermined injection depth, the injection well having a predetermined screen height; injecting seawater into the aquifer by a predetermined quantity of injection through the injection well; and forming an upper seawater area around the injection well by the injection of the seawater, wherein the upper seawater area is an area that is filled with seawater in an upper portion of the aquifer.

According to an embodiment of the present disclosure, the method may further include determining at least one variable of the distance, the injection depth, the screen height, and the quantity of injection by using a computer, and the determining the at least one variable may include: selecting a plurality of data sets according to at least one variable of the distance, the injection depth, the screen height, and the quantity of injection; outputting a plurality of simulation results by applying the plurality of data sets to a seawater-fresh water interface model; calculating evaluation values of the plurality of data sets $1w$ using a pre-defined evaluation function; and selecting a data set having a maximum evaluation value from among the calculated evaluation values.

In addition, according to an embodiment of the present disclosure, there is provided a computer-readable recording medium having a program recorded thereon to execute the determining described above.

According to an embodiment, a width of a fresh water outflow channel can be reduced by forming an upper seawater area by injecting seawater into an upper area of an aquifer, and a seawater-fresh water interface can be made to retreat to the sea, so that seawater intrusion can be mitigated.

In addition, according to an embodiment of the present disclosure, it is possible to optimally design an injection well to mitigate seawater intrusion, and according to this method, an injection well can be designed to mitigate seawater intrusion most effectively under a given condition, and an optimal quantity of seawater can be injected.

BRIEF DESCRIPTION OF THE DRAWINGS

The above and/or other aspects of the present disclosure will be more apparent by describing certain exemplary embodiments of the present disclosure with reference to the accompanying drawings, in which.

DETAILED DESCRIPTION OF EMBODIMENTS

Figure 1A:
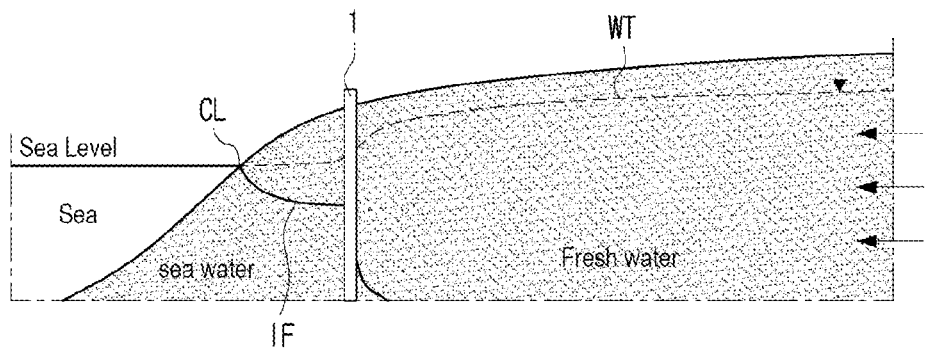
FIGS. 1A, 1B and 1C are views provided to explain related-art methods for mitigating seawater intrusion.
Figure 1B:
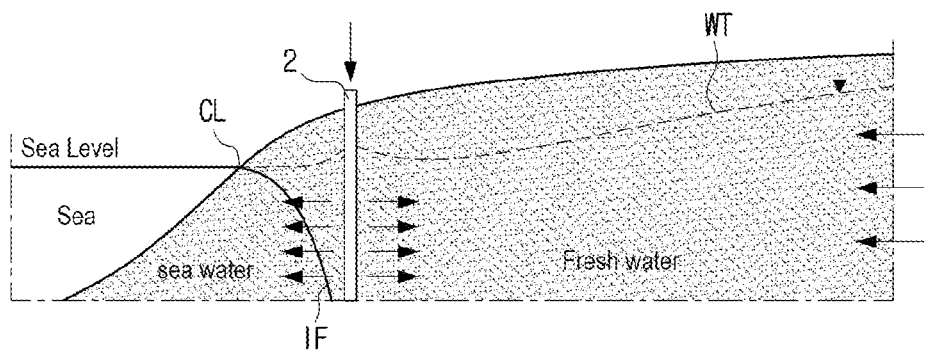
Figure 1C:
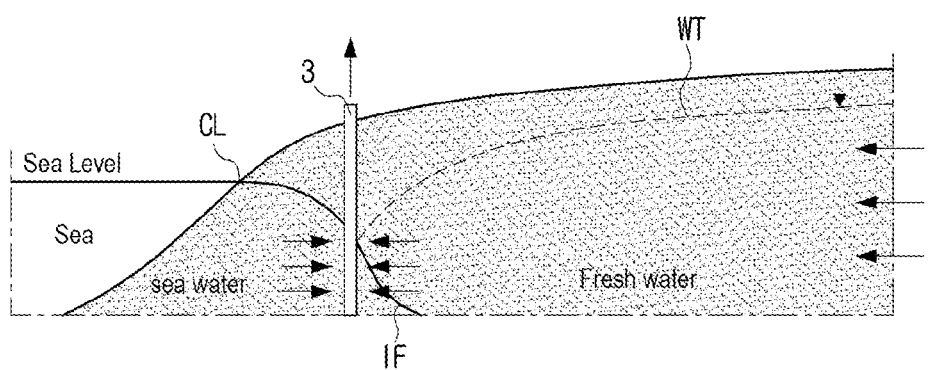

Exemplary embodiments will now be described more fully with reference to the accompanying drawings to clarify objects, other objects, features and advantages of the present disclosure. The exemplary embodiments may, however, be embodied in many different forms and should not be construed as limited to the exemplary embodiments set forth herein. Rather, the exemplary embodiments are provided so that this disclosure will be thorough and complete, and will fully convey the scope of the application to those of ordinary skill in the art.

In the drawings, dimensions of elements such as length, thickness, width may be exaggerated fir effective explanation of technical features.

In the detailed descriptions of the present disclosure, the singular forms "a," "an" and "the" are intended to include the plural forms as well, unless the context clearly indicates otherwise. It will be further understood that the terms "include," "configured with" and "comprise," when used in this specification, do not preclude the presence or addition of one or more other components.

Hereinafter, exemplary embodiments will be described in greater detail with reference to the accompanying drawings. The matters defined in the description, such as detailed construction and elements, are provided to assist in a comprehensive understanding of the exemplary embodiments. However, it is apparent that the exemplary embodiments can be carried out by those of ordinary skill in the art without those specifically defined matters. In the description of the exemplary embodiment, certain detailed explanations of related art are omitted when it is deemed that they may unnecessarily obscure the essence of the inventive concept.

Figure 2:
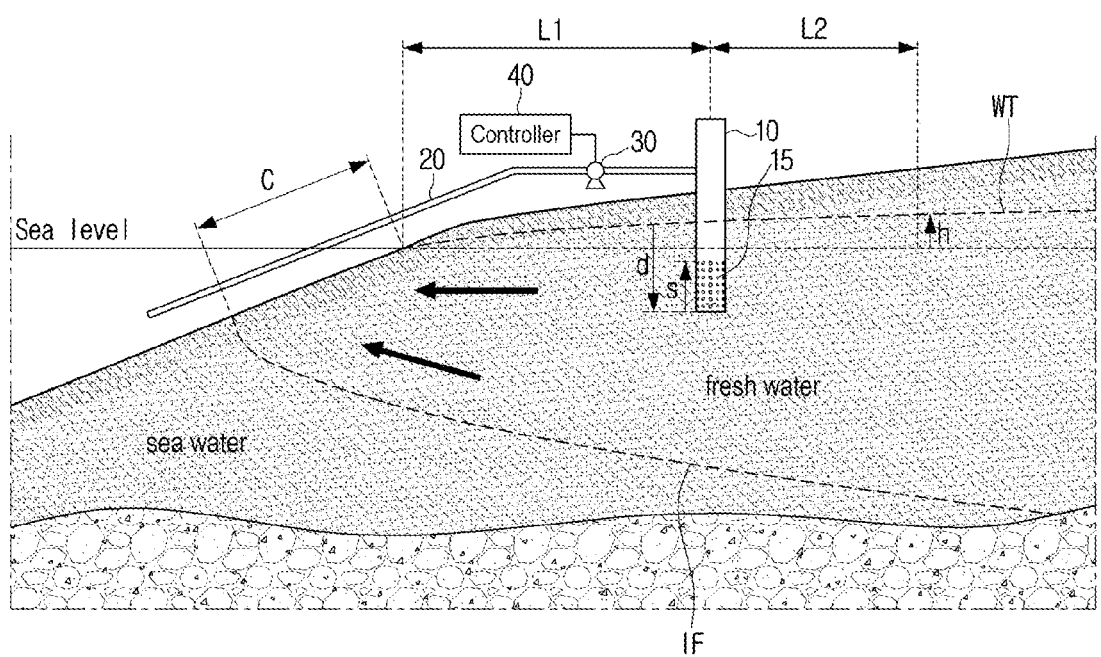
FIG. 2 is a view provided to explain a method for mitigating seawater intrusion according to an embodiment of the present disclosure.

FIG. 2 is a view provided to explain a method for mitigating seawater intrusion according to an embodiment of the present disclosure, and schematically illustrates a cross section of the ground of a coastal area and a seawater intrusion mitigation system installed in this area according to an embodiment of the present disclosure.

Referring to FIG. 2, the ground typically includes a topsoil layer, a confined aquifer, and bed rock formed in sequence from the surface of the earth to the bottom. The topsoil layer is about tens of centimeters thick from the surface of the earth. An aquifer holding groundwater (fresh water) exists under the topsoil layer. The aquifer is formed of components of soil having a high permeability coefficient, and is typically formed of various rock constituents such as sand, gravel, sandstone, alluvial layer, cavernous limestone, cracked marble, cracked granite, elastic quartzite, etc.

As shown in FIG. 2, in the normal coastal area, seawater passes through a permeable layer and permeates the land, and, since the specific gravity of seawater (about 1.025) is higher than the specific gravity of fresh water, the seawater permeates under the fresh water, thereby generating a seawater-fresh water interface IF. That is, as shown in FIG. 2, the seawater-fresh water interface IF (hereinafter, referred to as an "interface") is the same as the water level of the sea on a shoreline, and the height of the interface IF gradually decreases toward the land. In addition, the fresh water held in an aquifer of the land is discharged to the sea by water pressure of fresh water existing further inland. That is, the fresh water is discharged toward the sea as indicated by the arrows in FIG. 2, and in this case, a passage through which the fresh water is discharged to the sea will be referred to as a fresh water outflow channel C in the detailed description.

The seawater intrusion mitigation system on the ground according to an embodiment of the present disclosure may include an injection well 10 having a screen 15 formed thereon, a pipeline 20, a pump 30, and a controller 40. The injection well 10 is a well for injecting seawater into the aquifer of the land, and is installed at a point spaced apart from the shoreline toward the land by a predetermined distance L1. The injection well 10 may be buried to a predetermined depth, and in the case of the illustrated embodiment, may be buried to a predetermined depth d from a water table Val. The predetermined depth d may be set by considering characteristics or depth of the aquifer in a specific condition, and may be, for example, several meters to tens of meters.

The injection well 10 includes the screen 15 formed on a lower portion thereof and having a plurality of penetration holes formed thereon. The screen 15 may be formed to a predetermined heights from a lower end of the injection well 10, and may discharge seawater in the injection well 10 to the aquifer therethrough.

An upper portion of the injection well 10 is connected with the pipeline 20 for receiving seawater, and the pump 30 is installed on the pipeline 20. In an embodiment, one end of the pipeline 20 is positioned under the sea level of the sea, and the other end is connected to the injection well 10. Accordingly, seawater is supplied to the injection well 10 by an operation of the pump 30, and is injected into the aquifer through the penetrating holes of the screen 15 of the injection well 10.

Figure 3:
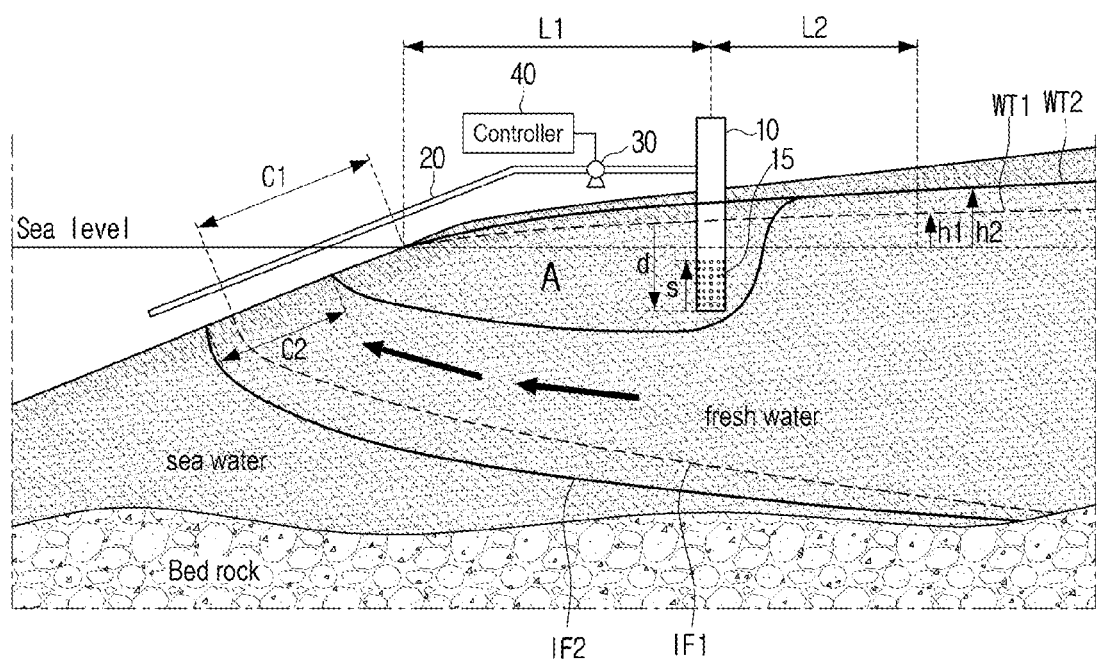
FIG. 3 is a view provided to explain an effect of mitigating seawater intrusion according to an embodiment.

FIG. 3 is a view provided to explain an effect of mitigating seawater intrusion when seawater is injected into a fresh water layer through the injection well 10. As can be seen from comparison of FIGS. 2 and 3, when a predetermined quantity of seawater Q is injected into the aquifer through the injection well 10, an "upper seawater area A" is formed in an upper portion of the aquifer. That is, since the seawater and the fresh water are not mixed with each other due to a difference in their density, the seawater injected through the injection well 10 is not mixed with the fresh water in the aquifer, and forms an independent seawater area in an upper portion of the aquifer.

The upper seawater area A is formed around the injection well 10 by the seawater injected through the injection well 10, and the fresh water in the aquifer influences the upper seawater area A thereabove while escaping to the sea through the channel C. Accordingly, the upper seawater area A is formed in a shape to be extended to the sea from the injection well 10 as shown in FIG. 3, not in a shape having a predetermined radius from the center of the injection well 10.

The upper seawater area A is formed as described above, such that the groundwater level and the seawater-fresh water interface IF are changed. Before the seawater is injected through the injection well 10, that is, before the upper seawater area A is formed, the seawater-fresh water interface IF1 is formed as indicated by the dashed line, and in this case, the fresh water outflow channel has a channel width indicated by "C1" (the "width" of the channel in the detailed description refers to a length indicated by "C", "C1", "C2" in FIG. 2 or 3, not a length in the horizontal direction). In addition, it is assumed that, before the seawater is injected, the water table WT1 at a position distanced from the injection well 10 by a predetermined distance L2 is h1 high from the sea level.

When seawater is injected through the injection well 10 and the upper seawater area A is formed, the upper seawater area A serves as a kind of barrier and the width of the fresh water outflow channel is reduced to "C2". In addition, as the width of the fresh water outflow channel C2 is reduced as described above, the seawater-fresh water interface IF retreats to the sea by the pressure of the fresh water, and accordingly, the seawater-fresh water interface IF2 is further pushed out to the sea by the injection of the seawater, compared to the interface IF1 before the seawater is injected, so that there is an effect of mitigating seawater intrusion.

On the other hand, regarding a change in the water table, the water table WT1 is h1 high from the sea level before the seawater is injected, but, when the upper seawater area A is formed by the injection of the seawater, the upper seawater area A serves as a barrier and the pressure of the fresh water generally increases and thus the water table WT2 slightly increases to h2. Therefore, in an embodiment, it is preferable to determine the quantity of seawater to be injected through the injection well 10 by considering influence of the injection of the seawater through the injection well 10, that is, a change in the channel width of the fresh water outflow channel C and an increase in the water table WT.

Since the upper seawater area. A formed by injecting the predetermined quantity of seawater Q into the injection well 10 maintains its area for a considerable time, there is no need to continuously inject fresh water into the well or pump the seawater, unlike in the related-art methods. However, if the injection of the seawater is stopped after the upper seawater area A is formed according to the present disclosure, the seawater moves toward the sea with the fresh water along an interface between the upper seawater area A and the fresh water outflow channel C formed thereunder, and thus the upper seawater area A is gradually lost. Accordingly, the intrusion of the seawater can be continuously prevented by measuring a change in the scale of the upper seawater area A and controlling the operation of the pump 30 by the controller 40 based on the change or at predetermined intervals to inject an appropriate quantity of seawater through the injection well 10.

Figure 4:
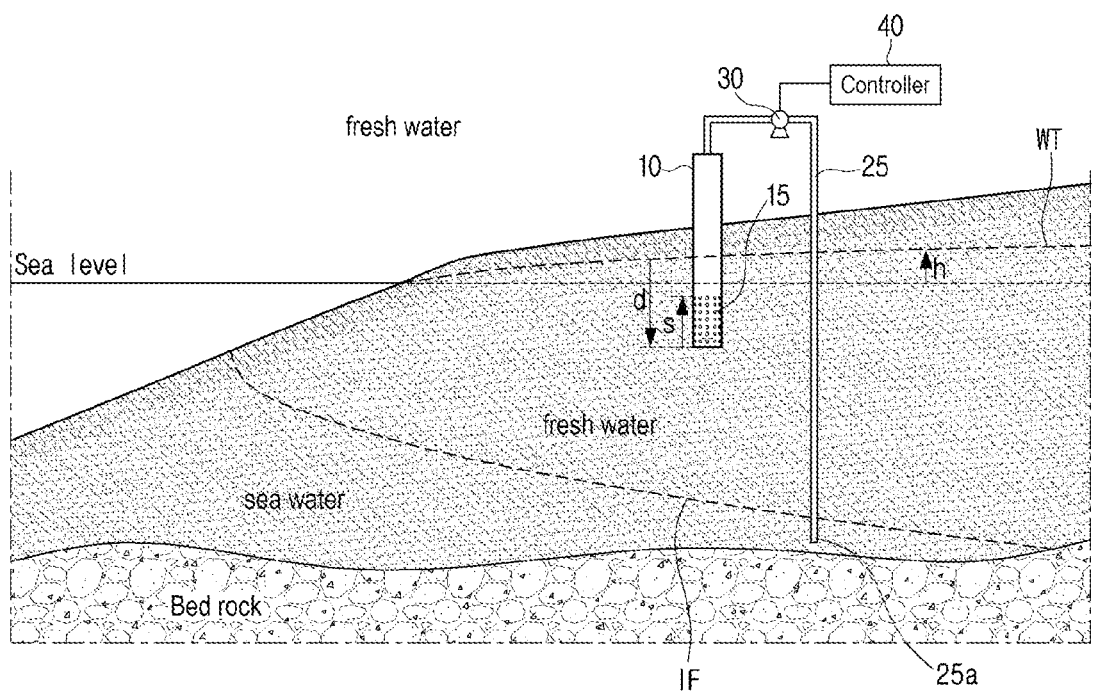
FIG. 4 is a view provided to explain a method for mitigating seawater intrusion according to an alternative embodiment.

FIG. 4 is a view provided to explain a method for mitigating seawater intrusion according to an alternative embodiment of the present disclosure, and a seawater intrusion mitigation system according to an embodiment may include an injection well 10 having a screen 150 formed thereon, a pipeline 25, a pump 30, and a controller 40. The well 10, the pump 30, and the controller 40 of FIG. 4 have the same or similar configurations and roles as or to those of FIG. 2, and thus a redundant explanation thereof is omitted.

In the embodiment of FIG. 4, the injection well 10 is connected to the pipeline 25 and one end of the pipeline 25 fluidly communicates with the injection well 10 and the other end 25*a* is positioned under an inland seawater-freshwater interface IF. That is, as shown in FIG. 4, the other end 25*a* of the pipeline 25 may be positioned between the interface IF and the bed rock formed thereunder.

If the pipeline 25 is buried as described above, seawater of the area where the other end 25*a* of the pipeline 25 is positioned is pumped and is supplied to the injection well 10 when seawater is injected by the injection well 10. Therefore, there is an effect of discharging the seawater in this area to the outside, and accordingly, the interface IF further retreats to the sea, so that the effect of mitigating seawater intrusion can be enhanced.

Hereinafter, conditions for maximizing the effect of mitigating seawater intrusion will be described with reference to FIGS. 3 to 5.

As described above, by forming the upper seawater area. A by injecting seawater through the injection well 10, the width of the fresh water outflow channel C is reduced and the interface IF is pushed out to the sea, so that seawater intrusion can be mitigated. However, the pressure of the fresh water increases and the water table WT rises. Since the reduction of the width of the fresh water outflow channel C contributes to reduction of outflow of the fresh water and to the retreat of the interface IF, there is a positive effect of the reduction of the width of the fresh water outflow channel C, but there may be a need to restrict the rising of the water table to a specific height or higher according to a regional condition.

Accordingly, it may be preferable to form the upper seawater area A by injecting seawater and to reduce the width of the fresh water outflow channel C as much as possible, but it may also be preferable not to increase the water table if possible. In an embodiment of the present disclosure, it may be preferable to have the effect of mitigating seawater intrusion while reducing outflow of fresh water by appropriately adjusting the separation distance L1 of the injection well 10, the injection depth a', the screen heights, and the quantity of injected seawater Q.

Regarding the separation distance L1 of the injection well 10, as the injection well 10 is installed closer to the sea, the upper seawater area A is lost more quickly and thus the effect is reduced, but, as the injection well 10 is installed far from the sea, the effect of reducing the width of the fresh water outflow channel C is reduced. Regarding the injection depth d of the injection well and the screen height s, when the injection depth d is short and seawater is injected close to the ground, a margin of increase of the water table (h2-h1) increases, but the effect of reducing the width of the fresh water outflow channel C is reduced. When the injection well 10 is installed deeper, the quantity of injected seawater Q increases. As seawater is more injected, there is an advantage of mitigating seawater intrusion, but in this case, there is a disadvantage that a management cost increases.

In an embodiment of the present disclosure, performance evaluation may be performed with respect to at least one item of the separation distance L1 of the injection well, the injection depth a', the screen height s, and the quantity of injection Q, and appropriate values for the above-described variables may be set. In an embodiment, an evaluation function regarding at least one of the "fresh water outflow channel reduction rate" and the "water table rising rate" may be defined as a performance evaluation function, and a value of at least one of the separation distance L1, the injection depth a, the screen height s, and the quantity of injection Q may be set based on the evaluation function.

For example, according to an embodiment, the evaluation function F1 may include the item "fresh water outflow channel reduction rate", and in this case, the evaluation function F1 may be defined as shown in Equation presented below or may be defined by a certain function that is proportional to Equation 1:

$$\text{Evaluation Function } (F1) = \frac{\text{Fresh water Outflow Channel}(C2)\text{ after application}}{\text{Fresh water Outflow Channel}(C1)\text{ before application}} \quad \text{Equation 1}$$

The right side of the above-described equation indicates the fresh water outflow channel reduction rate, and the denominator indicates a width of the fresh water outflow channel C1 before seawater is injected through the injection well 10, and the numerator indicates a width of the fresh water outflow channel C2 after seawater is injected. As the fresh water outflow channel reduction rate is smaller, that is, as a value of the evaluation function F1 is smaller, the effect of mitigating seawater intrusion is better.

In another embodiment, an evaluation function F2 may include the item "water table rising rate", and for example, the evaluation function F2 may be defined as shown in Equation 2 presented below or may be defined by a certain function that is proportional to Equation 2:

$$\text{Evaluation Function } (F2) = \frac{\text{Water Table } (h2) \text{ after application}}{\text{Water Table } (h1) \text{ before application}} \quad \text{Equation 2}$$

The right side of the above-described equation indicates the water table rising rate, and the denominator indicates the water table h1 before seawater is injected through the injection well 10, and the numerator indicates the water table h2 after seawater is injected. As the water table rising rate is smaller, that is, as a value of the evaluation function F2 is smaller, the water table does not rise and the effect is better.

In still another embodiment, an evaluation function F3 may include both the "fresh water outflow channel reduction rate" and the "water table rising rate", That is, when the above-described two items are considered, the evaluation function F3 may be defined as shown in Equation 3 presented below or may be defined by a certain function that is proportional to Equation 3:

$$\text{Evaluation Function } (F3) = \alpha \frac{\text{Fresh water Outflow Channel } (C2) \text{ after application}}{\text{Fresh water Outflow Channel } (C1) \text{ before application}} + \beta \frac{\text{Water Table } (h2) \text{ after application}}{\text{Water Table } (h1) \text{ before application}} \quad \text{Equation 3}$$

The two right terms of the above-described evaluation function indicate the fresh water outflow channel reduction rate and the water table rising rate, respectively. In addition, $\alpha$ and $\beta$ applied to the respective terms indicate weight values of the two items, and each of $\alpha$ and $\beta$ has a value between 0 and 1, and is set to satisfy $\alpha+\beta=1$.

A value of the evaluation function may be derived by calculating with respect to at least one of the fresh water outflow channel reduction rate and/or the water table rising rate through a computer simulation by using the above-described evaluation functions F1 to F3, or by measuring real geography, and, based on the value of the evaluation function, an appropriate value regarding at least one variable of the separation distance L1 of the injection well, the injection depth d, the screen height s, and the quantity of injection Q may be set.

Figure 5:
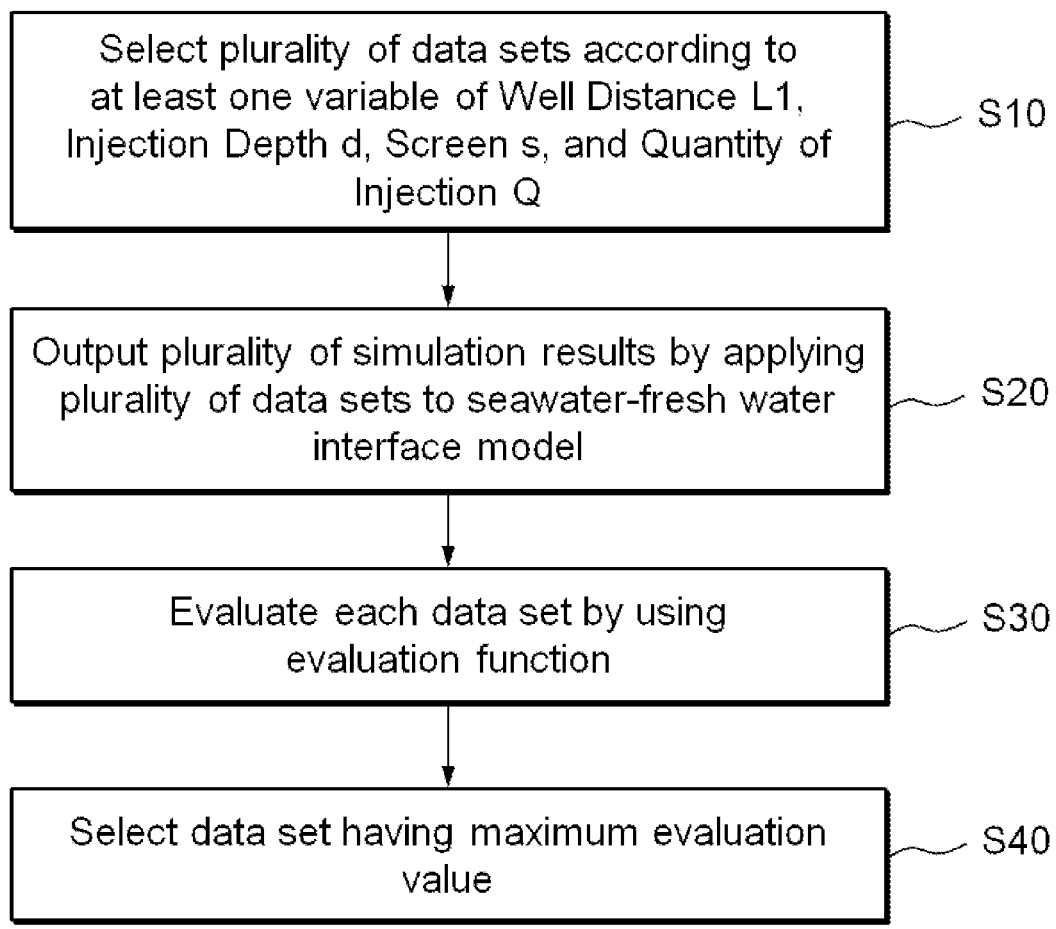
FIG. 5 is a flowchart provided to explain a method for an optimal design for a well for mitigating seawater intrusion.

FIG. 5 is a view illustrating an optimization design method of the injection well 10 by using the above-described evaluation function according to an embodiment According to this method, a step of determining at least one variable of the separation distance L1, the injection depth d, the screen height s, and the quantity of injection Q by using a computer may be performed.

Referring to FIG. 5, at step S10, a plurality of data sets including at least one variable of the separation distance L1 of the injection well 10, the injection depth d, the screen height s, and the quantity of injection Q may be selected. For example, initial condition data regarding the injection well 10 may be inputted to a predetermined optimization algorithm, and a plurality of data sets may be outputted from the algorithm. Herein, the initial condition is data to be inputted when the optimization algorithm is executed, and for example, may include data regarding the width of the fresh water outflow channel C1, the water table h1 of the aquifer, and the seawater-fresh water interface IF1 before seawater is injected into the injection well 10.

When the initial condition data is inputted to the optimization algorithm, the optimization algorithm generates the plurality of data sets each including a set of determination variables such as the separation distance L1, the injection depth d, the screen height s, and the quantity of injection Q. In an embodiment, the optimization algorithm may use one of well-known optimization algorithms, such as a genetic algorithm, a neural network algorithm, particle swarming, differential evolution, newton, steepest descent, etc.

Next, at step S20, each data set is inputted to a predetermined seawater-fresh water interface model, and a result of simulation of the seawater-fresh water interface is outputted from this model. In this case, the result of simulation may include a result of simulation regarding a change in the seawater-fresh water interface IF, a scale and an interface of the upper seawater area A, and a change in the water table.

Thereafter, at step S30, each data set is evaluated according to the result of simulation by using an evaluation function. For example, an evaluation value may be calculated by calculating at least one of the fresh water outflow channel reduction rate and/or the water table rising rate according to each result of simulation by using one of the first to third evaluation functions F1 to F3 described above. When the evaluation value of each data set is calculated, a data set of a determination variable having a maximum value is selected as optimal data (S40), and the injection well 10 is designed and installed according to the determination variable of the selected data set, such as the separation distance L1, the injection depth d, the screen height s, and the quantity of injection Q, and seawater is injected into the injection well 10 as much as the quantity of injection Q.

The above-described method may be performed in a certain server or a computer such as a terminal. In an embodiment, the computer may include a processor, a memory, and a storage device. The storage device is a storage medium that semi-permanently stores data like a hard disk driver or a flash memory, and may store at least one of the above-described various algorithms, for example, the optimization algorithm, and software or programs of the seawater-fresh water interface model.

Various programs or algorithms may be stored in the storage device and may be loaded onto the memory under control of the processor. Alternatively, some programs or algorithms may exist in a separate server or storage device installed outside the computer, and, when data or variables are transmitted from the computer to the corresponding external server or device, the external server or device may execute some steps of the program or algorithm and then may transmit resulting data to the computer.

While the present disclosure has been shown and described with reference to certain preferred embodiments thereof, it will be understood by those skilled in the art that various changes in form and details may be made therein without departing from the spirit and scope of the present disclosure as defined by the appended claims. Therefore, the scope of the present disclosure is defined not by the detailed descriptions of the present disclosure but by the appended claims, and all differences within the scope will be construed as being included in the present disclosure.

| DESCRIPTION OF REFERENCE NUMERALS | |
| --- | --- |
| 10: Injection well | 15: Screen |
| 20, 25: Pipeline | 30: Pump |
| 40: Controller | |

What is claimed is:

1. A method for mitigating seawater intrusion in the ground where an aquifer having a seawater-fresh water interface is formed, the method comprising:
 installing an injection well at a point on an inland area, spaced apart from the sea by a predetermined first distance to a predetermined injection depth, the injection well having a predetermined screen height;
 injecting seawater into the aquifer by a predetermined quantity of injection through the injection well; and
 forming an upper seawater area around the injection welt by the injection of the seawater,
 wherein the upper seawater area is an area that is filled with seawater in an upper portion of the aquifer.

2. The method of claim 1, wherein the predetermined quantity of injection is set according to a width of a fresh water outflow channel which is a passage through which fresh water is discharged to the sea from the aquifer.

3. The method of claim 1, wherein the predetermined quantity of injection is set according to a water table rising rate at a point spaced apart from the injection well by a predetermined second distance.

4. The method of claim 1, further comprising a pipeline configured to supply seawater to the injection well,
 wherein one end of the pipeline fluidly communicates with the injection well, and the other end positioned under the seawater-fresh water interface of the inland area.

5. The method of claim 1, further comprising determining at least one variable of the first distance, the injection depth, the screen height, and the quantity of injection by using a computer.

6. The method of claim 5, wherein the determining comprises:
 selecting a plurality of data sets according to at least one variable of the first distance, the injection depth, the screen height, and the quantity of injection;
 outputting a plurality of simulation results by applying the plurality of data sets to a seawater-fresh water interface model;
 calculating evaluation values of the plurality of data sets by using a pre-defined evaluation function; and
 selecting a data set having a maximum evaluation value from among the calculated evaluation values.

7. The method of claim 6, wherein the selecting the plurality of data sets comprises selecting the plurality of data sets by applying an optimization algorithm to initial condition data, and
 wherein the initial condition includes data regarding a fresh water outflow channel, a water table of the aquifer, and the seawater-fresh water interface before seawater is injected into the injection well.

8. The method of claim 7, wherein the optimization algorithm is one of a genetic algorithm and a neural network algorithm.

9. The method of claim 6, wherein the evaluation function comprises an item regarding a fresh water outflow channel reduction rate, and
 wherein the fresh water outflow channel reduction rate is proportional to [fresh water outflow channel after seawater is injected fresh water outflow channel before seawater is injected].

10. The method of claim 6, wherein the evaluation function comprises an item regarding a water table rising rate, and
 wherein the water table rising rate is proportional to [water table after seawater is injected water table before seawater is injected].

11. The method of claim 6, wherein the evaluation function comprises an item regarding a fresh water outflow channel reduction rate and a water table rising rate,
 wherein the fresh water outflow channel reduction rate is proportional to [fresh water outflow channel after seawater is injected fresh water outflow channel before seawater is injected], and
 wherein the water table rising rate is proportional to [water table after seawater is injected water table before seawater is injected].

\* \* \* \* \*